United States Patent [19]

Hobo et al.

[11] 3,978,424
[45] Aug. 31, 1976

[54] TWO-PHASE PULSE GENERATOR HAVING VOLTAGE CONTROLLED PULSE WIDTH

[75] Inventors: Nobuhito Hobo, Inuyama; Sumihiro Kaga, Inazawa, both of Japan

[73] Assignee: Nippondenso Co., Ltd., Japan

[22] Filed: May 30, 1975

[21] Appl. No.: 582,151

[30] Foreign Application Priority Data
June 25, 1974  Japan .............................. 49-72936

[52] U.S. Cl. .................................... 331/45; 328/34; 328/62; 331/74; 331/143; 331/177 R
[51] Int. Cl.² ...................... H03K 3/02; H03K 5/15
[58] Field of Search ............... 331/45, 74, 111, 143, 331/177 R; 328/34, 62

[56] References Cited
UNITED STATES PATENTS 3,573,664  4/1971  Jacob ................................. 331/143
3,842,371  10/1974  Kelley ........................ 331/177 R X

*Primary Examiner*—Siegfried H. Grimm
*Attorney, Agent, or Firm*—Cushman, Darby & Cushman

[57] ABSTRACT

A two-phase pulse signal generator which includes a first triangular signal generator in the form of a closed loop oscillator, a second triangular signal generator for generating a signal which is inverted with respect to the first triangular signal and a couple of comparators for comparing the respective triangular wave signals with a common control signal representative of a control requirement. The two-phase pulse signals are obtained from the respective comparators and the time duration of each of the pulse signals is proportional to the control voltage.

3 Claims, 5 Drawing Figures

TWO-PHASE PULSE GENERATOR HAVING VOLTAGE CONTROLLED PULSE WIDTH

BACKGROUND OF THE INVENTION

The present invention relates to an improvement in a two-phase pulse signal generating circuit in which the time duration of the pulse signals at the output thereof varies in response to a control signal applied to the signal generating circuit.

A conventional two-phase pulse generator typically comprises, for example, a pulse generator for generating pulses of a predetermined frequency, a flip-flop circuit connected to the pulse generator and a pair of monostable multivibrators each connected to the respective output terminals of the flip-flop circuit, wherein the pulses having the predetermined frequency are applied to the flip-flop circuit to provide a two-phase trigger, one of which pulses is applied to the one of the monostable multivibrators and the other of which is applied to the other multivibrator, thereby generating two-phase pulse signals.

However, in the conventional two-phase pulse generator described above, since the flip-flop circuit and the monostable multivibrators are triggered by pulse signals, they are apt to malfunction due to pulse noise signals and accordingly, such a two-phase pulse generator is not suitable for use in an automotive vehicle which is subjected to various kinds of pulse noise signals.

It is, therefore, an object of the present invention to provide a two-phase pulse signal generating circuit which is not responsive to pulsed noise signals and is suitable for use in an automobile.

It is another object of the present invention to provide a two-phase pulse signal generating circuit in which a first reference signal which linearly increases and decreases at a predetermined cycle and a second reference signal which is inverted with respect to the first reference signal are respectively applied to a couple of comparators which compare the respective signals with a control signal to generate two-phase pulse signals, the time duration of which varies in response to the control signal.

It is a further object of the present invention to provide a two-phase pulse generator in which a first triangular wave signal is inverted to provide a second triangular signal and wherein the first and second triangular signals are respectively compared with a control voltage by a couple of comparators to provide two-phase pulse signals.

It is a still further object of the present invention to provide a closed loop oscillator comprising a Schmitt circuit and an integrator circuit in which the frequency of the triangular wave signal is changed merely by changing a bias voltage.

SHORT STATEMENT OF THE INVENTION

Accordingly, this invention relates to a two-phase pulse signal generator which includes a first triangular signal generator in the form of a closed loop oscillator, a second triangular signal generator for generating a signal which is inverted with respect to the first triangular signal and a couple of comparators for comparing the respective triangular wave signals with a common control signal representative of a control requirement. The two-phase pulse signals are obtained from the respective comparators and the time duration of each of the pulse signals is proportional to the control voltage.

BRIEF DESCRIPTION OF THE DRAWINGS

Other objects, features and advantages of the present invention will become more fully apparent from the following detailed description of the preferred embodiment, the appended claims and the accompanying drawings in which:

DETAILED DESCRIPTION OF THE PREFERRED EMBODIMENT

Figure 1:
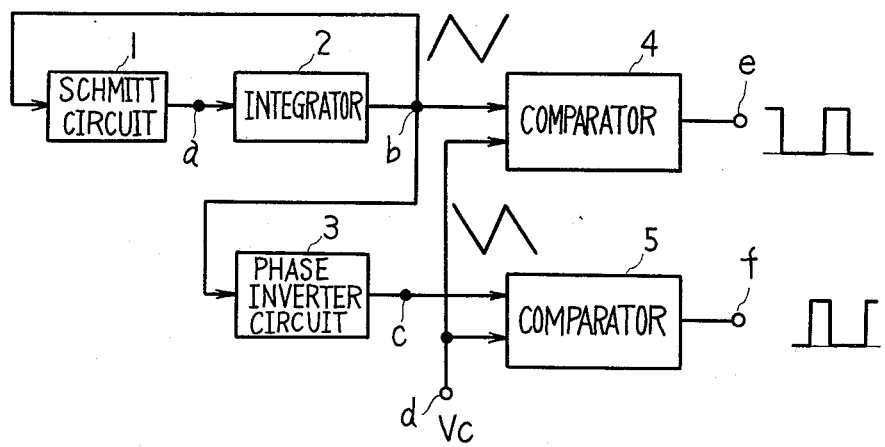
FIG. 1 is a block diagram for a preferred embodiment of the two-phase pulse signal generator of the present invention.

In FIG. 1, a Schmitt circuit of conventional design is connected to an integrator circuit 2, the output of which is fed back to the input of the Schmitt circuit 1 to form a first triangular wave generator in the form of a closed loop oscillator. The frequency of the triangular wave voltage signal at the output terminal $b$ is determined by the time constant of the integrator circuit 2 and the threshold voltage of the Schmitt circuit 1.

A phase inverter circuit 3 inverts the triangular wave voltage signal at terminal $b$ to provide a second triangular wave voltage signal. A pair of comparators 4 and 5 have applied thereto a control voltage at one input terminal and the respective triangular waves at the other input terminal thereof with the outputs of the comparators providing pulse signals having a time duration proportional to the control voltage.

Figure 2:
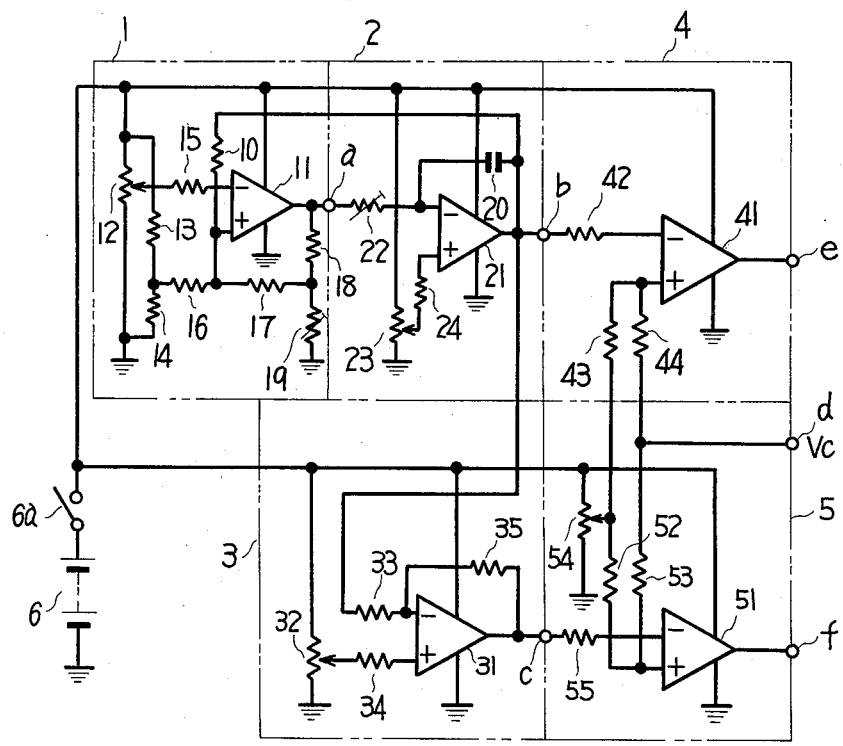
FIG. 2 is a more detailed circuit diagram of the embodiment shown in FIG. 1.
Figure 4:
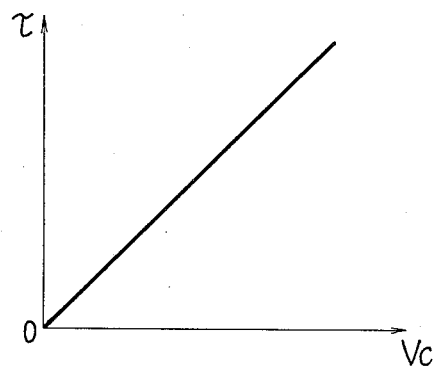
FIG. 4 is a graph showing the relation between the time duration of the two-phase pulse signals of the embodiment described and a control voltage applied thereto.

Refer now to the circuit diagram of FIG. 2. A battery 6 supplies electric power to the respective circuits via a switch $6a$. Numerals 11, 21, 31, 41 and 51 identify, respectively, differential amplifiers of conventional design such as, for example, $\mu$ 741 made by Fairchild Industries, Inc. The Schmitt circuit 1 comprises the differential amplifier 11, a potentiometer 12 for providing the maximum bias voltage of the triangular wave voltage signal and a variable resistor 19 for controlling the amplitude thereof. As mentioned before, the output voltage of the integrator circuit 2 is fed back to the input terminal of the Schmitt circuit 1 so as to form a closed loop oscillator for generating triangular wave voltage signals at the output terminal $b$ of the integrator circuit 2. The integrator circuit 2 comprises the differential amplifier 21, a variable resistor 22, a variable potentiometer 23 for defining the gradient of the leading and trailing portions of the triangular wave and a capacitor 20. The variable resistor 22 and the capacitor 20 provide the time constant of the integrator circuit 2. The inverter circuit 3 comprises the differential amplifier 31 and a potentiometer 32 for providing the bias voltage of the second triangular wave voltage signal. The comparator 4 comprises the differential amplifier 41 and the comparator 5 comprises the differential amplifier 51 and a potentiometer 54 for zero point adjustment, which varies the time duration of the output pulses appearing on both the output terminals e and f of the comparators 4 and 5. With the potentiometer 54, the time duration of the output pulses can be made proportional to a control voltage as shown in FIG. 4.

In this embodiment, the first triangular wave voltage signal is made symmetric and the potentiometers 12 and 32 of the Schmitt circuit 1 and the inverter circuit 3 are equally set so that one of the pulse signals appearing on the output terminals e and f is shifted by a half cycle with respect to the other.

In operation, before the switch 6a is closed, the output terminal of the integrator circuit 2 is at a zero potential and thus the noninverting terminal of the differential amplifier 11 is at a zero potential. When the switch 6a is closed, a bias voltage is applied to the potentiometer 12 and the output terminal a of the differential amplifier 11 is rendered approximately zero. The zero potential is in turn applied to the inverting terminal of the differential amplifier 21 in the integrator circuit 2. As the noninverting terminal of the differential amplifier 21 is given a bias voltage through the potentiometer 23, the capacitor 20 is charged to raise the potential of the output terminal b of the differential amplifier 21 from the zero voltage level. When the potential of the output terminal b is raised to exceed that of the inverting terminal of the differential amplifier 11, the potential of the output terminal a raises up to a high level. Consequently, the potential of the inverting terminal of the differential amplifier 21 exceeds that of the noninverting terminal of the same. As a result, the capacitor 20 is discharged, thereby gradually lowering the potential of the output terminal. When the output terminal a is brought up to the high level potential, the voltage biased below the potential of the inverting terminal of the differential amplifier 11 by the variable resistor 19 is fed back to the noninverting terminal of the differential amplifier 11. When the potential of the terminal b goes below the bias voltage provided by the potentiometer 12 subtracted by the fedback voltage, in other words, when the sum of the potential of the terminal b and the fedback voltage goes below the bias voltage provided by the potentiometer 12, the potential of the output terminal a returns to zero level. At the same time, the fedback voltage goes to zero and the Schmitt circuit 1 is returned to the original state. Thereafter, the low level potential of the Schmitt circuit is applied to the inverting terminal of the integrator circuit 2 and the potential of the output terminal b thereof is increased gradually as the integration is being carried out. Thus, the same operation described above is repeated so that the first triangular wave voltage signal appears on the output terminal b with the amplitude equal to the fedback voltage.

Figure 3:
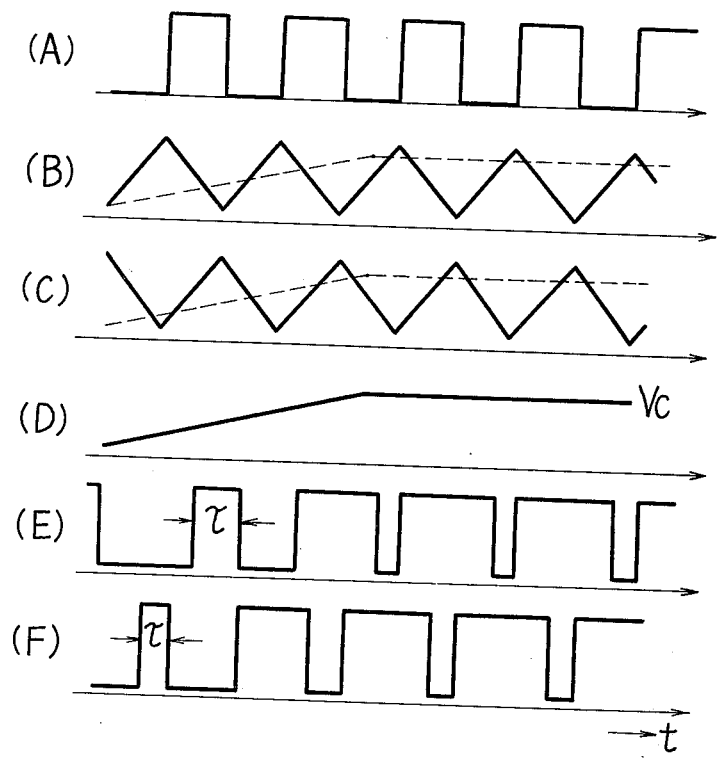
FIG. 3 illustrates respective voltage waveforms appearing on specific terminals of the circuit shown in FIG. 2.

In (A) and (B) of FIG. 3, the stable signal waves appearing on the terminals a and b are shown respectively. The first triangular wave voltage signal is applied to the inverting terminal of the phase inverter circuit 3, the output signal of which appears on the output terminal c as the second triangular wave voltage signal with its phase opposite to that of the first triangular wave voltage signal as shown in (C) of FIG. 3. When a control voltage representative of a control requirement appears on the terminal d, as shown in (D) of FIG. 3, it is applied to each terminal of the differential amplifiers 41 and 51. To the inverting terminals thereof are applied the above-mentioned first and second triangular wave voltage signals, thereby obtaining the two-phase pulse signals at the output terminals e and f. Each of the signals has a half-cycle-phase difference at the terminals e and f, with the time duration of each signal being proportional to the control voltage Vc in a cycle with the triangular wave voltage signals, which are shown in (E) and (F) of FIG. 3. The relation between the control voltage and the time width is as shown in FIG. 4.

Figure 5:
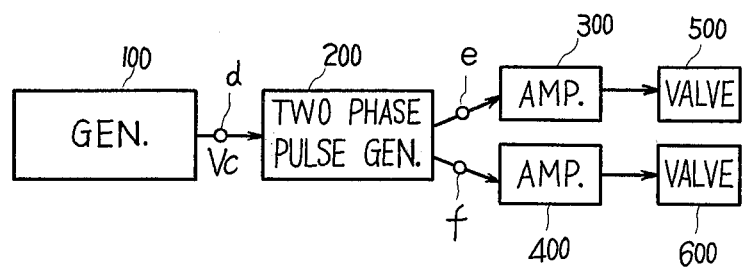
FIG. 5 is a schematic block diagram of a system for utilizing the two-phase pulse signal generator of the present invention.

A block diagram of a fuel injection system for an internal combustion engine is shown in FIG. 5, in which the two-phase pulse signal generator is employed. In the figure, numeral 100 designates means for generating a control voltage Vc which is a function of fuel amount determined by rotation and intake air amount of an engine, etc., 200 the two-phase pulse signal generator of the present invention and numerals 300 and 400 are amplifiers for driving electromagnetic valves 500 and 600, respectively. The valves open alternately to inject fuel in an amount proportional to the time duration of the two-phase pulse signals. As a result, the fuel amount injected to the engine is made proportional to the control voltage Vc, and accordingly, it can be seen that fuel injection is controlled by engine parameters as aforementioned. In the system, pulsation of the fuel flow through a couple of the electromagnetic valves driven by the two-phase pulse signals is decreased to a half of that driven by a single phase signal so that the system is advantageously applicable to a continuously combusting engine such as gas turbine engine.

In the above embodiment, the triangular wave voltage signal generator could be substituted for by a reference pulse generator generating linearly increasing and decreasing voltage signals at a predetermined cycle such as a saw tooth generator or an approximation signal generator for generating voltage signals which are approximate to the linearly increasing and decreasing voltage signals.

What is claimed is:

1. A two-phase pulse generating circuit comprising:
    first circuit means for generating a first voltage which linearly increases and decreases in a predetermined cycle,
    second circuit means connected to said first circuit means for inverting said first voltage to provide a second voltage,
    means for generating a control voltage representing a condition to be controlled,
    a first comparator having one input terminal connected to said first circuit means and the other input terminal connected to said control voltage generating means, and
    a second comparator having one input terminal connected to said second circuit means and the other input terminal connected to said control voltage generating means, wherein two-phase pulses are generated on the output terminals of said first and second comparators.

2. A two-phase pulse generating circuit as claimed in claim 1, wherein said first circuit means comprises:
    a Schmitt circuit, and
    an integration circuit connected to said Schmitt circuit, the output of said integration circuit being fed back to the input of said Schmitt circuit to form a closed loop oscillator.

3. A two-phase pulse generating circuit comprising:
    a triangular wave voltage generator, an inverter circuit with its input terminal connected to the output terminal of said triangular wave voltage generator, a common potentiometer, the voltage of which varies in response to a condition to be controlled, a first comparator having an input terminal connected to the output terminal of said triangular wave voltage generator and another input terminal connected to said common potentiometer, a second comparator having an input terminal connected to the output terminal of said inverter circuit and another input terminal connected to said common potentiometer, said first and second comparators having respective output terminals on which two-phase pulses appear.

* * * * *